US010756262B2

(12) United States Patent
Komura et al.

(10) Patent No.: US 10,756,262 B2
(45) Date of Patent: Aug. 25, 2020

(54) SPIN-ORBIT-TORQUE MAGNETIZATION ROTATIONAL ELEMENT, SPIN-ORBIT-TORQUE MAGNETORESISTANCE EFFECT ELEMENT, MAGNETIC MEMORY, AND SPIN-ORBIT-TORQUE MAGNETIZATION ROTATIONAL ELEMENT MANUFACTURING METHOD

(71) Applicant: TDK CORPORATION, Tokyo (JP)

(72) Inventors: Eiji Komura, Tokyo (JP); Yohei Shiokawa, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 16/282,884

(22) Filed: Feb. 22, 2019

(65) Prior Publication Data

US 2019/0267542 A1    Aug. 29, 2019

(30) Foreign Application Priority Data

Feb. 26, 2018    (JP) .................................. 2018-031984

(51) Int. Cl.
*H01L 43/14*    (2006.01)
*H01L 27/22*    (2006.01)
(Continued)

(52) U.S. Cl.
CPC ............ *H01L 43/14* (2013.01); *G11C 11/161* (2013.01); *H01L 27/222* (2013.01); *H01L 43/04* (2013.01);
(Continued)

(58) Field of Classification Search
CPC ....... H01L 43/14; H01L 27/222; H01L 43/04; H01L 43/08; H01L 43/065; H01L 43/10
(Continued)

(56) References Cited

U.S. PATENT DOCUMENTS 8,350,347 B2    1/2013 Gaudin et al.
2015/0200003 A1*    7/2015 Buhrman ................. G11C 11/18
365/158
(Continued)

FOREIGN PATENT DOCUMENTS

JP    2017-028277 A    2/2017
WO    2016/021468 A1    2/2016

OTHER PUBLICATIONS

Miron et al.; "Perpendicular switching of a single ferromagnetic layer induced by in-plane current injection"; Nature, vol. 476, pp. 189-194; Aug. 11, 2011.
(Continued)

*Primary Examiner* — Fernando L Toledo
*Assistant Examiner* — Adam S Bowen
(74) *Attorney, Agent, or Firm* — Oliff PLC

(57) ABSTRACT

A spin-orbit-torque magnetization rotational element includes: a spin-orbit-torque wiring which extends in a first direction; and a first ferromagnetic layer which is laminated in a second direction intersecting the spin-orbit-torque wiring, wherein the spin-orbit-torque wiring includes a convex portion which protrudes in the second direction in relation to a first surface on the side of the first ferromagnetic layer at a connecting part between the spin-orbit-torque wiring and the first ferromagnetic layer.

14 Claims, 7 Drawing Sheets

(51) Int. Cl.
*G11C 11/16* (2006.01)
*H01L 43/04* (2006.01)
*H01L 43/08* (2006.01)
*H01L 43/06* (2006.01)
*H01L 43/10* (2006.01)

(52) U.S. Cl.
CPC .............. *H01L 43/065* (2013.01); *H01L 43/08* (2013.01); *H01L 43/10* (2013.01)

(58) Field of Classification Search
USPC ........................................................ 257/421
See application file for complete search history.

(56) References Cited

U.S. PATENT DOCUMENTS

| 2015/0348606 | A1  | 12/2015 | Buhrman et al. |
| 2017/0018704 | A1* | 1/2017  | Chuang ................ H01L 27/228 |
| 2017/0222135 | A1  | 8/2017  | Fukami et al. |

OTHER PUBLICATIONS

Kato et al.; "Observation of the Spin Hall Effect in Semiconductors"; Science, vol. 306, pp. 1910-1913; Dec. 10, 2004.

Liu et al.; "Spin torque switching with the giant spin Hall effect of tantalum"; Science, vol. 336, 555; Mar. 13, 2012.

Liu et. al; "Current-Induced Switching of Perpendicularly Magnetized Magnetic Layers Using Spin Torque from the Spin Hall Effect"; Physical Review Letters; pp. 096602-1-096602-5; Aug. 31, 2012.

Lee et al.; "Threshold current for switching of a perpendicular magnetic layer induced by Spin Hall effect"; Applied Physics Letters 102; 112410; Mar. 25, 2013.

Lee et al.; "Thermally activated switching of perpendicular magnet by spin-orbit spin torque"; Applied Physics Letters, 104, 072413; Feb. 21, 2014.

Fukami et al.; "Magnetization switching by spin-orbit torque in an antiferromagnet-ferromagnet bilayer system"; Nature Materials, 15, pp. 535-542; Feb. 15, 2016.

Fukami et al.; "A spin-orbit torque switching scheme with collinear magnetic easy axis and current configuration"; Nature Nanotechnology; pp. 1-6; Mar. 21, 2016.

Takahashi et al.; "Spin injection and detection in magnetic nanostructures"; Physical Review B 67, pp. 052409-1-052409-4; Feb. 28, 2003.

Seo et al.; "Area-Efficient SOT-MRAM With a Schottky Diode"; IEEE Electron Device Letters, vol. 37, No. 8; pp. 982-985; Aug. 2016.

* cited by examiner

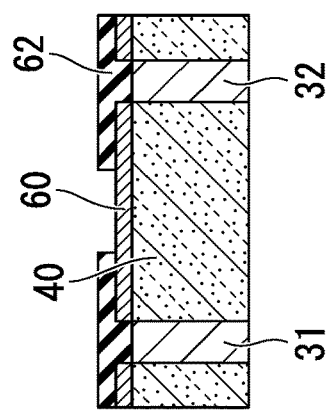
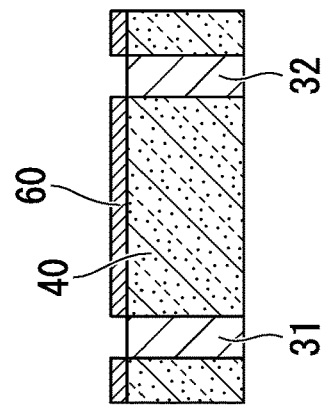
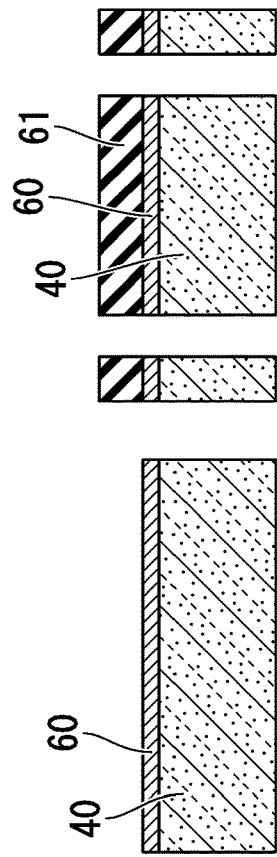
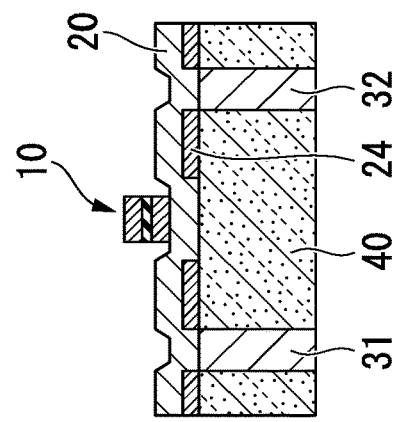
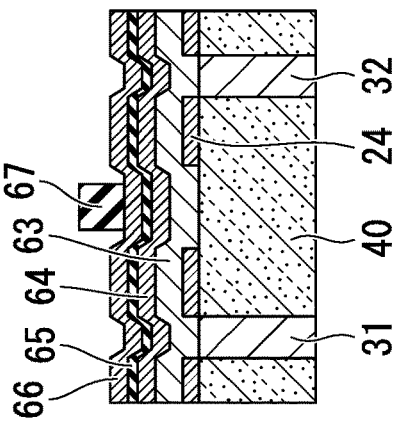
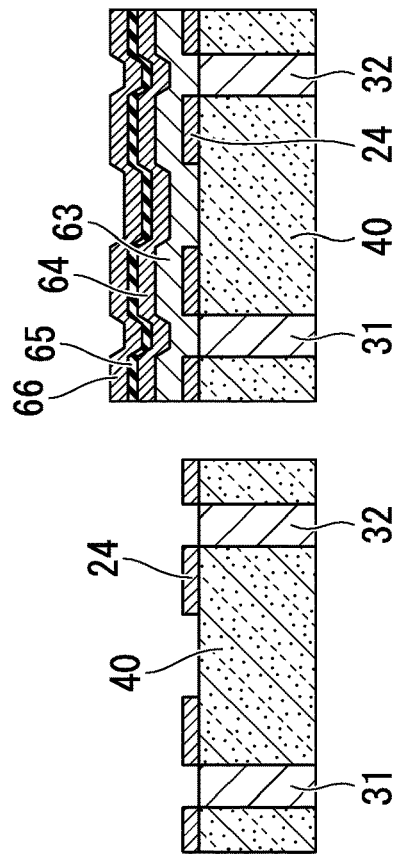

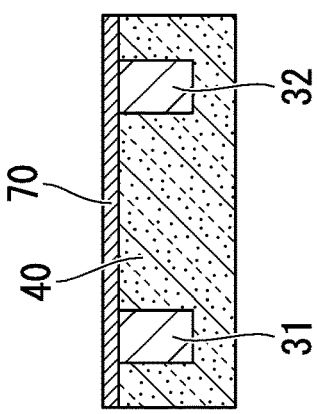
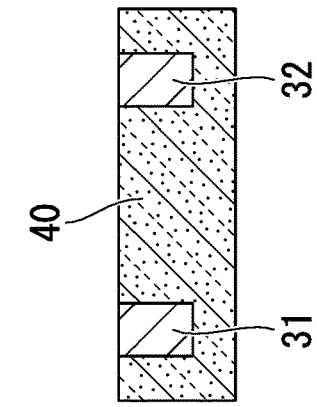
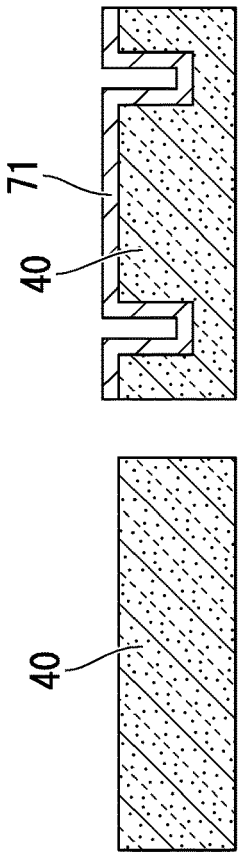
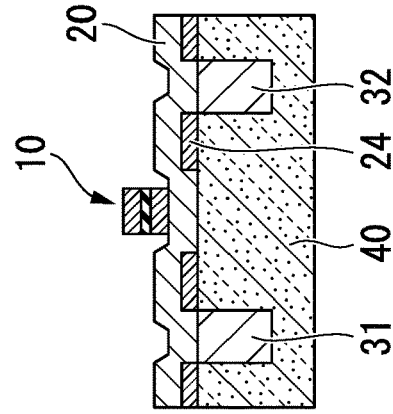
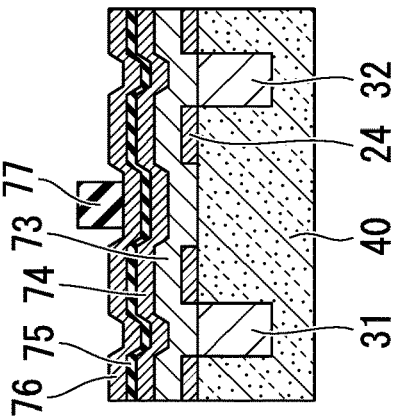
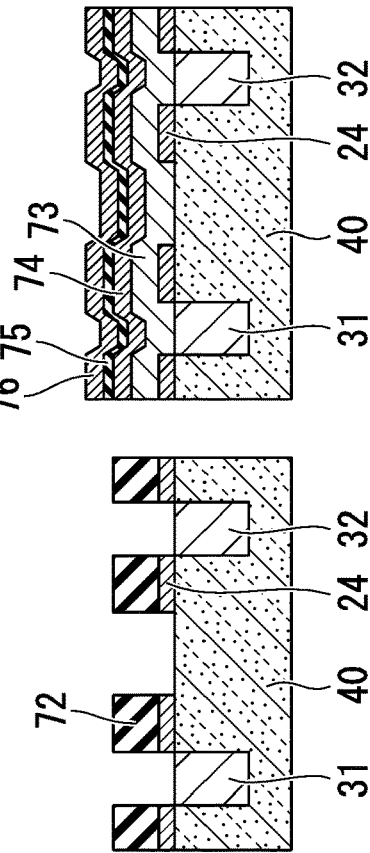

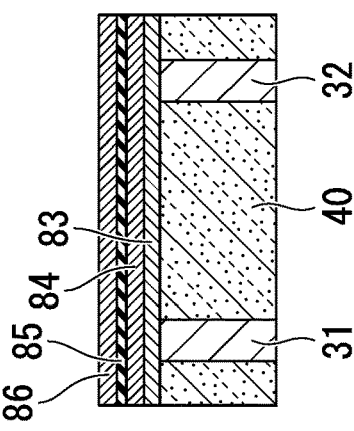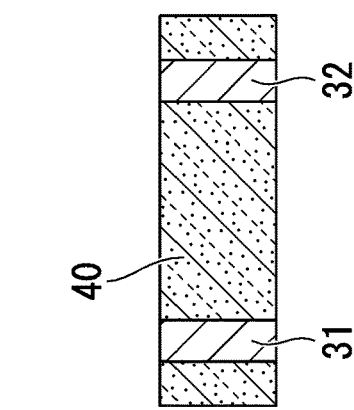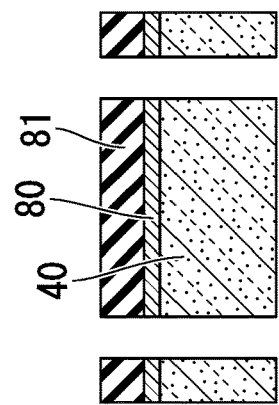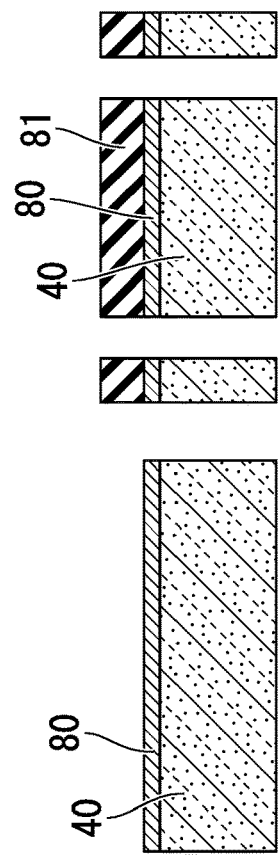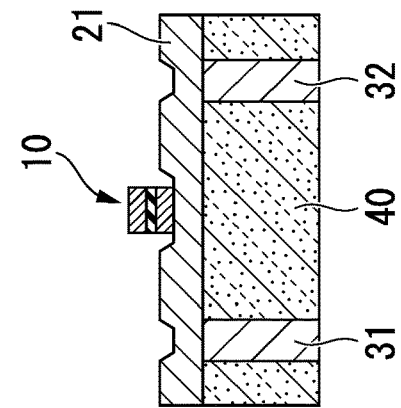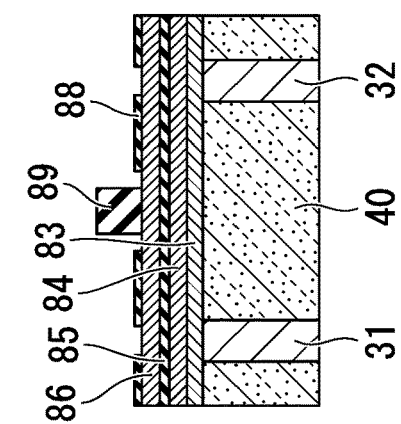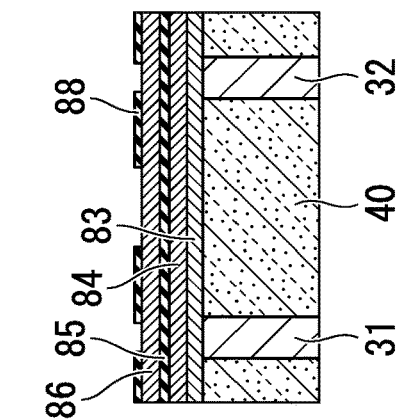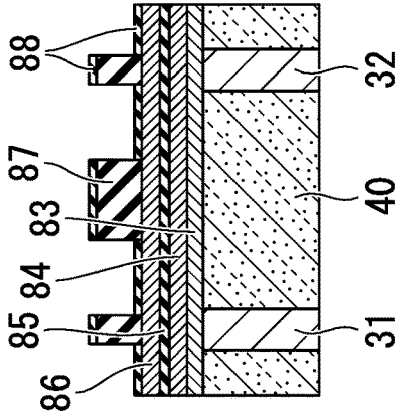

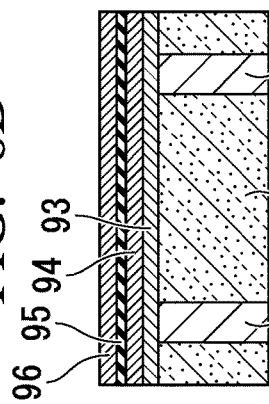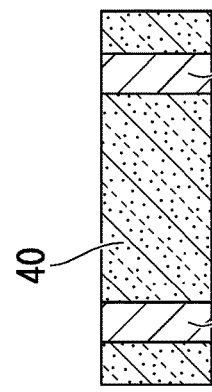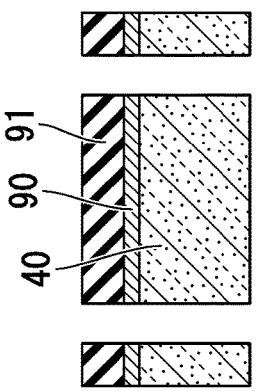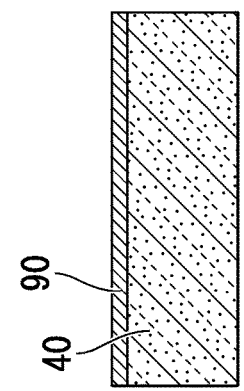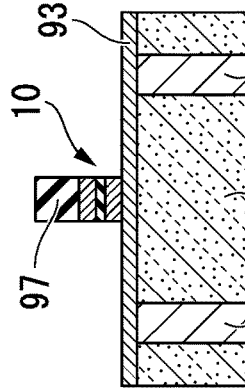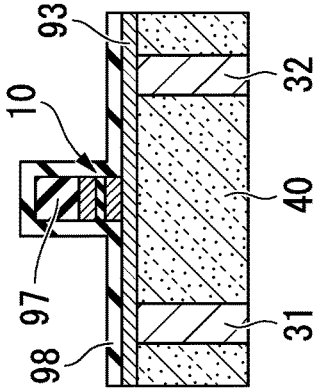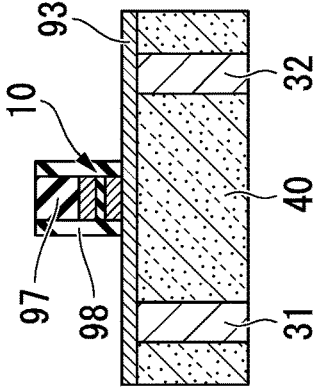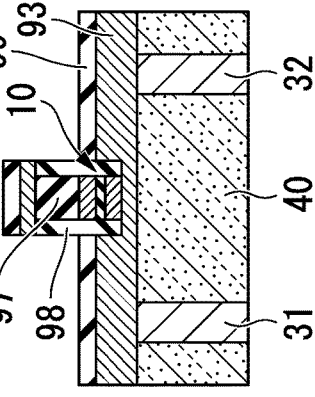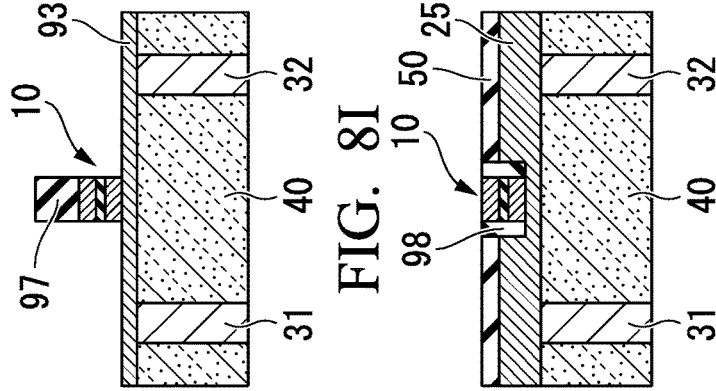

SPIN-ORBIT-TORQUE MAGNETIZATION ROTATIONAL ELEMENT, SPIN-ORBIT-TORQUE MAGNETORESISTANCE EFFECT ELEMENT, MAGNETIC MEMORY, AND SPIN-ORBIT-TORQUE MAGNETIZATION ROTATIONAL ELEMENT MANUFACTURING METHOD

TECHNICAL FIELD

The present disclosure relates to a spin-orbit-torque magnetization rotational element, a spin-orbit-torque magnetoresistance effect element, a magnetic memory, and a spin-orbit-torque magnetization rotational element manufacturing method.

This application claims right of priority to Japanese Patent Application No. 2018-031984 filed on Feb. 26, 2018 in Japan, the content of which is incorporated herein by reference.

BACKGROUND ART

A giant magnetoresistance (GMR) element including a multilayer film including a ferromagnetic layer and a nonmagnetic layer and a tunneling magnetoresistance (TMR) element using an insulating layer (a tunnel barrier layer, a barrier layer) in a nonmagnetic layer are known. These have gained attention as elements for magnetic sensors, high-frequency components, magnetic heads, and nonvolatile random access memories (MRAMs).

An MRAM reads and writes data by using a characteristic in which an element resistance of a GMR element or a TMR element changes when magnetization directions of two ferromagnetic layers sandwiching an insulation layer change. As a writing method of the MRAM, a writing method (magnetization reversal) using a magnetic field generated by a current or a writing method (magnetization reversal) using a spin transfer torque (STT) generated by a current flowing in a lamination direction of a magnetoresistance effect element is known.

In the magnetization reversal of a magnetoresistance effect element using an STT, a current needs to flow in the lamination direction of the magnetoresistance effect element when writing data. There are cases in which a writing current may degrade the characteristics of the magnetoresistance effect element.

Therefore, in recent years, writing methods which do not need to allow a current to flow in the lamination direction of the magnetoresistance effect element have gained attention. One of these methods is a writing method using a spin-orbit torque (SOT) (for example, see I. M. Miron, K. Garello, G. Gaudin, P.-J. Zermatten, M. V. Costache, S. Auffret, S. Bandiera, B. Rodmacq, A. Schuhl, and P. Gambardella, Nature, 476, 189 (2011)). The SOT is caused by a spin current generated by a spin-orbit interaction or a Rashba effect at an interface between dissimilar materials. A current causing the SOT in the magnetoresistance effect element flows in a direction intersecting the lamination direction of the magnetoresistance effect element. That is, since a current does not need to flow in the lamination direction of the magnetoresistance effect element, improvement in durability of the magnetoresistance effect element can thus be expected.

SUMMARY

Technical Problem

When a current flows to a predetermined spin-orbit-torque wiring containing a heavy metal or the like, many spins are implanted into a ferromagnetic material and a large SOT is generated. Meanwhile, the spin-orbit-torque wiring has an inferior thermal conductivity to that of copper wiring, aluminum wiring, and the like generally used for wiring. For that reason, the temperature of the ferromagnetic material connected to the spin-orbit-torque wiring increases and the magnetization stability of the ferromagnetic material is degraded. The degradation of the magnetization stability of the ferromagnetic material may cause a recording error in the magnetoresistance effect element.

The present disclosure has been made in view of the above-described circumstances and an object of the present disclosure is to provide a spin-orbit-torque magnetization rotational element having excellent heat exhausting performance.

Solution to Problem

The present inventors have found a configuration for an element having excellent heat exhausting performance by carrying out careful examination.

That is, the present disclosure provides the following means in order to solve the above-described problems.

(1) A spin-orbit-torque magnetization rotational element according to a first aspect includes: a spin-orbit-torque wiring which extends in a first direction; and a first ferromagnetic layer which is laminated in a second direction intersecting the spin-orbit-torque wiring, wherein the spin-orbit-torque wiring includes a convex portion which protrudes in the second direction in relation to a first surface at a connecting part between the spin-orbit-torque wiring and the first ferromagnetic layer.

(2) In the spin-orbit-torque magnetization rotational element according to the above-described aspect, the convex portion may be configured to surround a periphery of the first ferromagnetic layer.

(3) In the spin-orbit-torque magnetization rotational element according to the above-described aspect, a side surface of the convex portion on the side of the first ferromagnetic layer may be inclined in a direction of away from the first ferromagnetic layer from the first surface toward a tip of the convex portion.

(4) The spin-orbit-torque magnetization rotational element according to the above-described aspect may further include an insertion layer which is provided at a surface of the spin-orbit-torque wiring, the surface being opposite to the side with the first ferromagnetic layer at a position where the convex portion of the spin-orbit-torque wiring is provided.

(5) In the spin-orbit-torque magnetization rotational element according to the above-described aspect, the spin-orbit-torque wiring may contain one or more elements selected from a group consisting of Ta, W, Pt, Au, Nb, Mo, Ru, Os, Rh, Ir, Pd, and Ag.

(6) A spin-orbit-torque magnetoresistance effect element according to a second aspect includes: the spin-orbit-torque magnetization rotational element according to the above-described aspect; a nonmagnetic layer which is laminated on a surface of the first ferromagnetic layer, the surface being opposite to a surface contacting the spin-orbit-torque wiring; and a second ferromagnetic layer which sandwiches the first ferromagnetic layer and the nonmagnetic layer, wherein the first ferromagnetic layer, the nonmagnetic layer, and the second ferromagnetic layer constitute a functional unit configured to exhibit a magnetoresistance effect.

(7) In the spin-orbit-torque magnetoresistance effect element according to the above-described aspect, a shortest distance between the convex portion and the functional unit may be equal to or smaller than a height of the functional unit.

(8) In the spin-orbit-torque magnetoresistance effect element according to the above-described aspect, a shortest distance between the convex portion and the functional unit may be equal to or larger than a difference between a height of the functional unit and a height of the convex portion.

(9) In the spin-orbit-torque magnetoresistance effect element according to the above-described aspect, a height of the convex portion may be equal to or smaller than a height of the functional unit.

(10) The spin-orbit-torque magnetoresistance effect element according to the above-described aspect may further include an interlayer insulating film configured to protect a side wall of the functional unit and the interlayer insulating film may be an oxide or a nitride of one or more elements selected from a group consisting of Si, Al, Ta, Mg, and Hf.

(11) A magnetic memory according to a third aspect further includes a plurality of spin-orbit-torque magnetoresistance effect elements according to the above-described aspect.

(12) A spin-orbit-torque magnetization rotational element manufacturing method according to a fourth aspect is a method of manufacturing the spin-orbit-torque magnetization rotational element according to the above-described aspect including the steps of: laminating a protection layer on a substrate and removing the protection layer excluding at least a position to be the convex portion; sequentially laminating layers to be the spin-orbit-torque wiring and the ferromagnetic layer on the protection layer; and forming a sacrificial layer on a part of the ferromagnetic layer and performing etching.

(13) A spin-orbit-torque magnetization rotational element manufacturing method according to a fifth aspect is a method of manufacturing the spin-orbit-torque magnetization rotational element according to the above-described aspect including the steps of: sequentially laminating layers to be the spin-orbit-torque wiring and the ferromagnetic layer on a substrate; forming a sacrificial layer coating portions to be the first ferromagnetic layer and the convex portion; and performing etching thorough the sacrificial layer.

(14) A spin-orbit-torque magnetization rotational element manufacturing method according to a sixth aspect is a method of manufacturing the spin-orbit-torque magnetization rotational element according to the above-described aspect including the steps of: sequentially laminating layers to be the spin-orbit-torque wiring and the ferromagnetic layer on a substrate; forming a protection layer coating portions to be the first ferromagnetic layer, removing an unnecessary portion, and forming the first ferromagnetic layer; forming a coating of an insulation layer coating the first ferromagnetic layer and the layer to be the spin-orbit-torque wiring; and laminating a material, which is a same as a material of the layer to be the spin-orbit-torque wiring, and thickening the layer to be the spin-orbit-torque wiring.

Advantageous Effects

It is possible to provide a spin-orbit-torque magnetization rotational element having excellent heat exhausting performance.

BRIEF DESCRIPTION OF DRAWINGS

FIGS. 5A to 5H are schematic diagrams showing a method of manufacturing the spin-orbit-torque magnetoresistance effect element according to the first embodiment.

FIGS. 6A to 6H are schematic diagrams showing the method of manufacturing the spin-orbit-torque magnetoresistance effect element according to the first embodiment.

FIGS. 7A to 7H are schematic diagrams showing the method of manufacturing the spin-orbit-torque magnetoresistance effect element according to the first embodiment.

FIGS. 8A to 8I are schematic diagrams showing the method of manufacturing the spin-orbit-torque magnetoresistance effect element according to the first embodiment.

DESCRIPTION OF EMBODIMENTS

Figure 1:
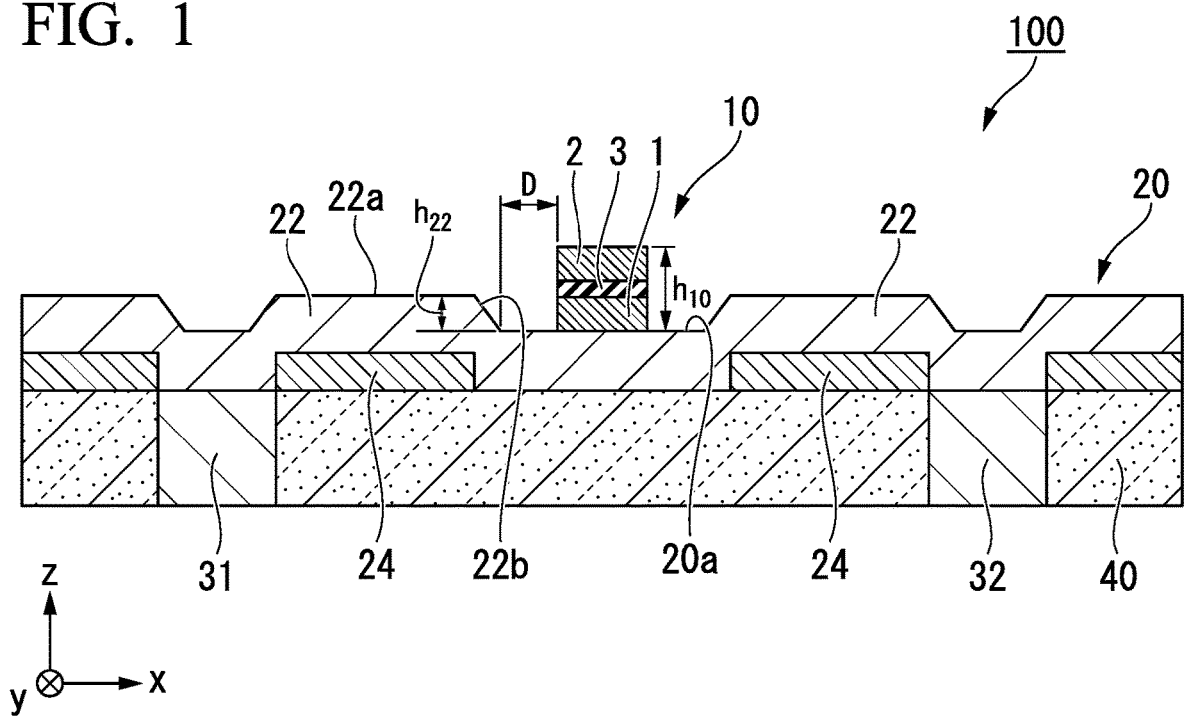
FIG. 1 is a schematic cross-sectional view of a spin-orbit-torque magnetoresistance effect element according to a first embodiment.

Hereinafter, the embodiment will be described in detail by appropriately referring to the drawings. In the drawings used for the following description, characteristic parts are enlarged for convenience of description in order to allow easy understanding of the features and hence the dimensional ratios between respective components may be different from actual ones. The materials, dimensions, and the like exemplified in the following description are merely examples and the present disclosure is not limited thereto. For example, the materials, dimensions, and the like can be appropriately changed within a range in which the effects of the present disclosure are exerted.

First Embodiment (Spin-Orbit-Torque Magnetoresistance Effect Element)

FIG. 1 is a schematic cross-sectional view of a spin-orbit-torque magnetoresistance effect element 100 according to a first embodiment. The spin-orbit-torque magnetoresistance effect element 100 shown in FIG. 1 includes a functional unit 10 which includes a first ferromagnetic layer 1, a second ferromagnetic layer 2, and a nonmagnetic layer 3 and a spin-orbit-torque wiring 20. In FIG. 1, a first electrode 31, a second electrode 32, and a substrate 40 are shown together.

Hereinafter, description will be made on the assumption that a first direction in which the spin-orbit-torque wiring 20 extends is defined as the x direction, a direction (a second direction) in which the first ferromagnetic layer 1 is laminated is defined as the z direction, and a direction which is orthogonal to either one of the x direction and the z direction is defined as the y direction.

<Functional Unit>

The functional unit 10 has the same configuration as that of a general magnetoresistance effect element. The functional unit 10 has the same configuration as that of a tunneling magnetoresistance (TMR) element when the nonmagnetic layer 3 is formed of an insulator and has the same configuration as that of a giant magnetoresistance (GMR) element when the nonmagnetic layer is formed of metal. The second ferromagnetic layer 2 is called a fixed layer or a reference layer and the first ferromagnetic layer 1 is called a free layer or a memory layer.

The functional unit 10 functions when the magnetization of the second ferromagnetic layer 2 is fixed to one direction (the z direction) and the magnetization direction of the first ferromagnetic layer 1 relatively changes. In the case of a coercivity-differing type (Pseudo spin valve type) MRAM, the coercivity of the second ferromagnetic layer 2 is set to be larger than the coercivity of the first ferromagnetic layer 1. In the case of an exchange bias type (a spin valve type) MRAM, the magnetization of the second ferromagnetic layer 2 is fixed by the exchange coupling with an antiferromagnetic layer.

The functional unit 10 may include layers other than the first ferromagnetic layer 1, the second ferromagnetic layer 2, and the nonmagnetic layer 3. For example, an antiferromagnetic layer for fixing the magnetization direction of the second ferromagnetic layer 2, an underlayer for improving the crystallinity of the functional unit 10, and the like can be exemplified.

A ferromagnetic material and particularly a soft magnetic material can be applied to the first ferromagnetic layer 1 and the second ferromagnetic layer 2. For example, a metal selected from a group consisting of Cr, Mn, Co, Fe, and Ni, an alloy containing at least one of these metals, an alloy containing these metals and at least one element from B, C, and N, or the like can be used. Specifically, Co—Fe, Co—Fe—B, or Ni—Fe can be exemplified. Further, when the first ferromagnetic layer 1 is an in-plane magnetization film, for example, a Co—Ho alloy ($CoHo_2$), a Sm—Fe alloy ($SmFe_{12}$), or the like is desirably used.

A Heusler alloy such as $Co_2FeSi$ may be used in the first ferromagnetic layer 1 and the second ferromagnetic layer 2. A Heusler alloy contains an intermetallic compound having a chemical composition of XYZ or $X_2YZ$, where X is a transition metal element or a noble metal element from the Co, Fe, Ni, or Cu groups in the periodic table, Y is a transition metal element from the Mn, V, Cr, or Ti groups or the types of element as for X, and Z is a typical element from Groups III to V. For example, $Co_2FeSi$, $Co_2FeGe$, $Co_2FeGa$, $Co_2MnSi$, $Co_2Mn_{1-a}Fe_aAl_bSi_{1-b}$, $Co_2FeGe_{1-c}Ga_c$, or the like can be exemplified. A Heusler alloy has a high spin polarization and can improve the MR ratio of the functional unit.

A known material can be used in the nonmagnetic layer 3.

For example, when the nonmagnetic layer 3 is formed of an insulator (in the case of a tunnel barrier layer), $Al_2O_3$, $SiO_2$, MgO, and $MgAl_2O_4$ can be used as the materials thereof. In addition, a material in which a part of Al, Si, and Mg is replaced by Zn, Be, or the like can be used. Among these, since MgO or $MgAl_2O_4$ is a material capable of realizing coherent tunneling, spin can be efficiently implanted. When the nonmagnetic layer 3 is formed of a metal, Cu, Au, Ag, or the like can be used as the material thereof. Further, when the nonmagnetic layer 3 is formed of a semiconductor, Si, Ge, $CuInSe_2$, $CuGaSe_2$, $Cu(In, Ga)Se_2$, or the like can be used as the material thereof.

<Spin-Orbit-Torque Wiring>

The spin-orbit-torque wiring 20 extends in the x direction. The spin-orbit-torque wiring 20 is connected to one surface of the first ferromagnetic layer 1. The spin-orbit-torque wiring 20 may be directly connected to the first ferromagnetic layer 1 or may be connected thereto through another layer.

The spin-orbit-torque wiring 20 generates a spin current by a spin Hall effect when a current flows thereto. The spin Hall effect is a phenomenon in which a spin current is generated in a direction orthogonal to a current direction on the basis of a spin-orbit interaction when a current flows. A mechanism in which a spin current is generated by the spin Hall effect will be described.

When a potential difference is applied across both ends of the spin-orbit-torque wiring 20, a current flows along the spin-orbit-torque wiring 20. When the current flows, a first spin S1 oriented in one direction and a second spin S2 oriented in a direction opposite to the first spin S1 are respectively bent in a direction orthogonal to the current. For example, the first spin S1 is bent in the z direction with respect to the traveling direction and the second spin S2 is bent in the −z direction with respect to the traveling direction.

The normal Hall effect and the spin Hall effect are the same in that a moving charge (electrons) is bent in the movement direction. Meanwhile, in the normal Hall effect, charged particles moving in a magnetic field are subjected to a Lorentz force and the movement direction bends, whereas, in the spin Hall effect, the only significant difference is that the spin movement direction is bent only due to the movement of electrons (the flow of the current) even when a magnetic field does not exist.

Since the number of electrons of the first spin S1 is the same as the number of electrons of the second spin S2 in a nonmagnetic material (a material which is not a ferromagnetic material), the number of electrons of the first spin S1 facing the +z direction is the same as the number of electrons of the second spin S2 facing the −z direction in the drawings. In this case, since the flows of electric charge cancel each other out and the amount of electric current becomes zero. The spin current which does not cause a current is specifically called a pure spin current.

When the flow of electrons of the first spin S1 is indicated by J↑, and the flow of electrons of the second spin S2 is indicated by J↓, the spin current indicated by $J_S$ is defined by $J_S$=J↑−J↓. The spin current $J_S$ flows in the z direction in the drawing. In FIG. 1, the first ferromagnetic layer 1 is present on the upper surface of the spin-orbit-torque wiring 20. For that reason, a spin is implanted to the first ferromagnetic layer 1.

As shown in FIG. 1, the spin-orbit-torque wiring 20 according to the embodiment includes a convex portion 22 which protrudes in the z direction in relation to a first surface 20a at the connecting part between the spin-orbit-torque wiring 20 and the first ferromagnetic layer 1.

The spin-orbit-torque wiring 20 is formed of any one of a metal, an alloy, an intermetallic compound, a metal boride, a metal carbide, a metal silicide, and a metal phosphide having a function of generating a spin current by the spin Hall effect when a current flows.

In order that the spin Hall effect is exhibited strongly and to increase the spin current generation amount, it is desirable to use a material having a large spin-orbit interaction in the spin-orbit-torque wiring 20. As a material that exhibits a large spin-orbit interaction, heavy metals, high resistivity materials, and the like are known. Here, a heavy metal means a metal having an atomic number of 39 or more and having d electrons or f electrons in the outermost shell.

When a heavy metal or a high resistivity material is used in the spin-orbit-torque wiring 20, the conductivity of the spin-orbit-torque wiring 20 is degraded. As a result, when a current flows to the spin-orbit-torque wiring 20, the spin-orbit-torque wiring 20 generates heat as Joule heat. When the spin-orbit-torque wiring 20 generates heat, the magnetization stability of the first ferromagnetic layer 1 is degraded and the magnetization of the first ferromagnetic layer 1 causes an unintended magnetization rotation (inversion), so that the functional unit 10 does not appropriately function.

When the spin-orbit-torque wiring 20 includes the convex portion 22, thermal radiation from the convex portion 22 to the functional unit 10 is promoted. The functional unit 10 mainly contains a metal and an upper electrode (not shown) for reading a change in resistance value of the functional unit 10 is connected to the upper portion of the functional unit 10. For that reason, the functional unit 10 has excellent heat exhausting performance. Since the heat generated by the spin-orbit-torque wiring 20 is transmitted to the functional unit 10 having excellent heat exhausting performance through the convex portion 22, the heat exhausting efficiency of the spin-orbit-torque magnetoresistance effect element 100 as a whole is improved.

Figure 2:
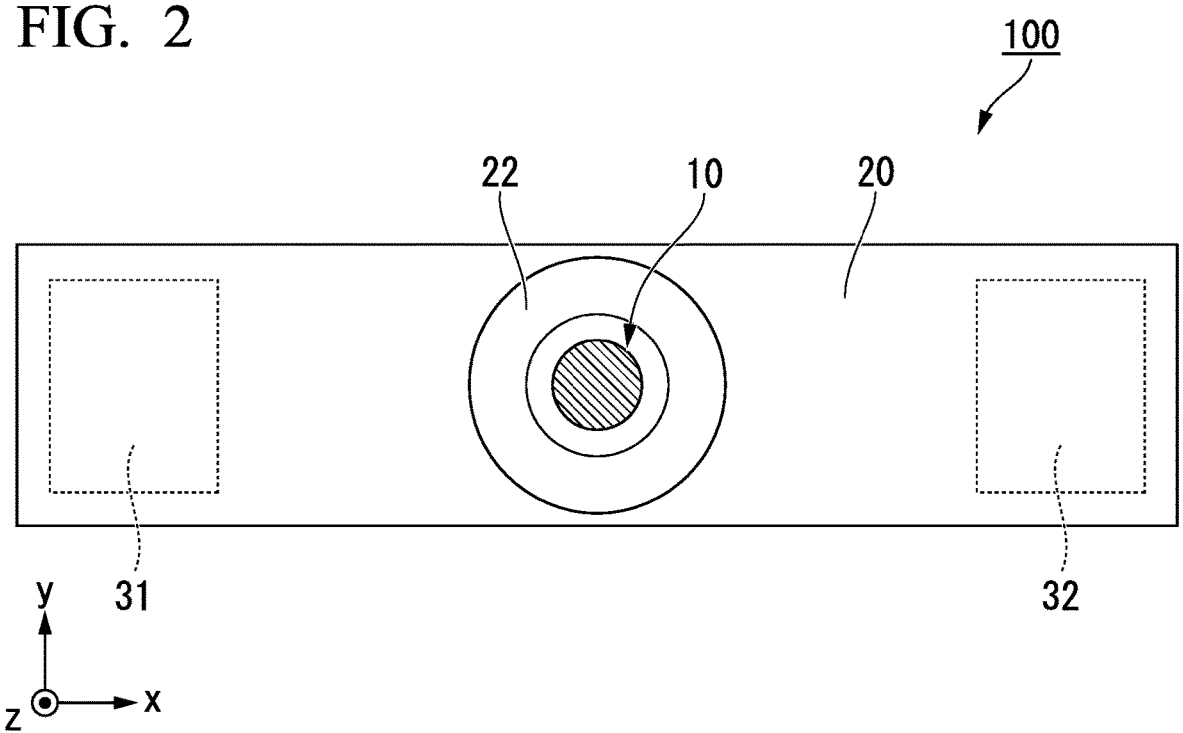
FIG. 2 is a schematic plan view of the spin-orbit-torque magnetoresistance effect element according to the first embodiment.

FIG. 2 is a schematic plan view of the spin-orbit-torque magnetoresistance effect element 100 according to the embodiment. The convex portion 22 shown in FIG. 2 configured to surround a periphery of the functional unit 10. When the convex portion 22 configured to surround a periphery of the functional unit 10, thermal radiation from the convex portion 22 to the functional unit 10 is promoted. As a result, the heat exhausting efficiency of the spin-orbit-torque magnetoresistance effect element 100 as a whole is further improved.

In the spin-orbit-torque magnetoresistance effect element 100 shown in FIG. 1, a shortest distance D between the convex portion 22 and the functional unit 10 is equal to or smaller than a height $h_{10}$ of the functional unit 10. When the convex portion 22 and the functional unit 10 are sufficiently close to each other, heat can be efficiently transmitted from the convex portion 22 to the functional unit 10. The height of the functional unit 10 is 36 nm as an example and a shortest distance D between the convex portion 22 and the functional unit 10 is desirably 36 nm or less and more desirably 30 nm or less.

Meanwhile, in the spin-orbit-torque magnetoresistance effect element 100 shown in FIG. 1, a shortest distance D between the convex portion 22 and the functional unit 10 is equal to or larger than a difference between the height $h_{10}$ of the functional unit 10 and the height $h_{22}$ of the convex portion 22. The height $h_{22}$ of the convex portion 22 means the length of a perpendicular line drawn from the tip 22a of the convex portion 22 to the extension surface of the first surface 20a. When a distance between the convex portion 22 and the functional unit 10 is too close, a likelihood that the convex portion 22 and the functional unit 10 will short-circuit with each other increases. A shortest distance D between the convex portion 22 and the functional unit 10 is desirably 5 nm or more and more desirably 10 nm or more.

Further, in the spin-orbit-torque magnetoresistance effect element 100 shown in FIG. 1, the height $h_{22}$ of the convex portion 22 is equal to or smaller than the height $h_{10}$ of the functional unit 10. Since it is difficult to form a space between the convex portion 22 and the functional unit 10 when the height $h_{22}$ of the convex portion 22 is high, the manufacturing process is then limited. The height $h_{22}$ of the convex portion 22 is desirably a half or less of the height $h_{10}$ of the functional unit 10 and more desirably ⅓ or less. Specifically, the height $h_{22}$ of the convex portion 22 is desirably 18 nm or less and more desirably 15 nm or less.

A side surface 22b of the convex portion 22 on the side of the functional unit 10 shown in FIG. 1 is inclined in a direction of away from the functional unit 10 from the first surface 20a toward the tip 22a of the convex portion 22. Since the side surface 22b is inclined in a predetermined direction, it is possible to prevent short-circuiting between the convex portion 22 and the functional unit 10.

It is desirable that the spin-orbit-torque wiring 20 contain at least one or more elements selected from a group consisting of Ta, W, Pt, Au, Nb, Mo, Ru, Os, Rh, Ir, Pd, and Ag. These elements strongly exhibit the spin Hall effect, can generate many spin currents, and have excellent thermal conductivity.

Further, the spin-orbit-torque wiring 20 may contain a magnetic metal. A magnetic metal refers to a ferromagnetic metal or an antiferromagnetic metal. When a nonmagnetic metal contains a very small amount of magnetic metal, a spin is scattered. When the spin is scattered, the spin-orbit interaction is improved and the spin current generation efficiency with respect to a current is improved. The spin-orbit-torque wiring 20 mainly contains only antiferromagnetic metals.

Meanwhile, when the amount of magnetic metal added increases too much, the generated spin current is scattered by the added magnetic metal and hence an action of decreasing the spin current becomes strong. For that reason, it is desirable that the molar ratio of the magnetic metal to be added be sufficiently smaller than the total molar ratio of the elements constituting the spin-orbit-torque wiring. The molar ratio of the magnetic metal to be added is desirably 3% or less as a whole.

The spin-orbit-torque wiring 20 may contain a topological insulator. A topological insulator is a material in which the inside of a substance is an insulator or a high resistance body, but a spin-polarized metallic state is generated on the surface. An internal magnetic field is generated in the material by the spin-orbit interaction. Therefore, even without an external magnetic field, a new topological phase develops due to the effect of the spin-orbit interaction. This is a topological insulator and a spin current is generated with high efficiency by a strong spin-orbit interaction and the breakage of inversion symmetry at the edge.

As the topological insulator, for example, SnTe, $Bi_{1.5}Sb_{0.5}Te_{1.7}Se_{1.3}$, $TlBiSe_2$, $Bi_2Te_3$, $(Bi_{1-x}Sb_x)_2Te_3$, or the like is desirable. These topological insulators can generate a spin current with high efficiency.

In FIG. 1, the spin-orbit-torque wiring 20 includes an insertion layer 24 which is provided at a surface of the spin-orbit-torque wiring, the surface being opposite to the side with the first ferromagnetic layer 1 at a position where the convex portion 22 is provided. The convex portion 22 is formed by raising a part of the spin-orbit-torque wiring 20 using the insertion layer 24.

It is desirable to form the insertion layer 24 of a material having excellent thermal conductivity. For example, aluminum, gold, silver, copper, or the like can be used. The material forming the insertion layer 24 is not limited to a metal, and may be an insulator.

<First Electrode and Second Electrode>

The first electrode 31 and the second electrode 32 are provided at a position sandwiching the functional unit 10 in the plan view. When a potential difference is applied across the first electrode 31 and the second electrode 32, a current flows in the spin-orbit-torque wiring 20. The first electrode and the second electrode 32 desirably contain any one of a group consisting of Ag, Au, Cu, Al, W, Co, Ni, Zn, Ta, TiN, and TaN. These materials have excellent thermal conductivity and hence can efficiently exhaust heat accumulated in the spin-orbit-torque wiring 20.

It is desirable to directly connect the first electrode 31 and the second electrode 32 to the spin-orbit-torque wiring 20 without sandwiching an oxide which disturbs the thermal conduction.

<Substrate>

It is desirable that the substrate 40 have excellent flatness. In order to obtain a surface having excellent flatness, for example, Si, AlTiC, or the like can be used as the material.

As described above, according to the spin-orbit-torque magnetoresistance effect element 100 of the embodiment, heat generated by the spin-orbit-torque wiring 20 can be efficiently exhausted to the functional unit 10 through the convex portion 22. As a result, since the magnetization stability of the first ferromagnetic layer 1 is improved, it is possible to prevent a problem in which the magnetization of the first ferromagnetic layer 1 causes an unintended magnetization rotation (inversion). That is, the reliability of the data of the spin-orbit-torque magnetoresistance effect element 100 is improved.

Although an example of the embodiment has been described in detail so far, the embodiment is not limited to this example and can be modified and changed into various forms.

Figure 3:
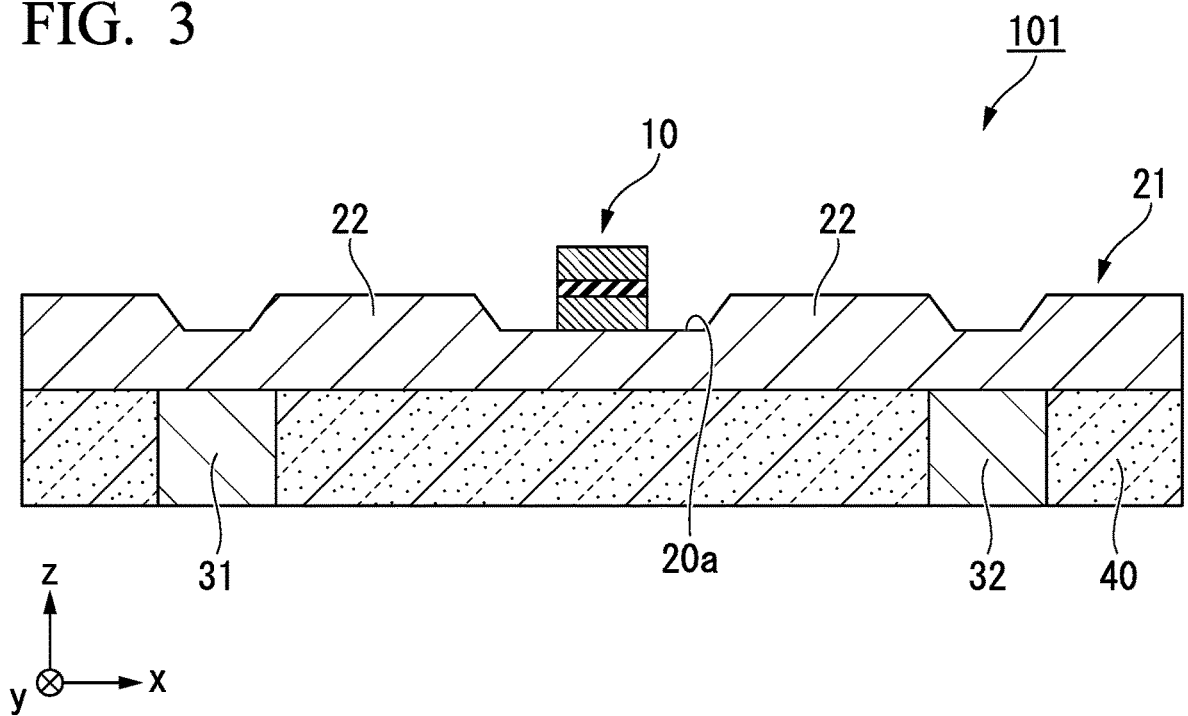
FIG. 3 is a schematic cross-sectional view of another example of the spin-orbit-torque magnetoresistance effect element according to the first embodiment.

For example, FIG. 3 is a schematic cross-sectional view of another example of the spin-orbit-torque magnetoresistance effect element according to the embodiment. A spin-orbit-torque magnetoresistance effect element 101 shown in FIG. 3 is different from the spin-orbit-torque magnetoresistance effect element 100 shown in FIG. 1 in that the insertion layer 24 is not provided. In the spin-orbit-torque magnetoresistance effect element 101 shown in FIG. 3, the thickness of the spin-orbit-torque wiring 21 is different in the x direction. The thickness of the spin-orbit-torque wiring 21 is thin at the connecting part with the functional unit 10. A current flowing through the spin-orbit-torque wiring 21 can generate many spin currents since a current density at the connecting part with the functional unit 10 increases.

Figure 4:
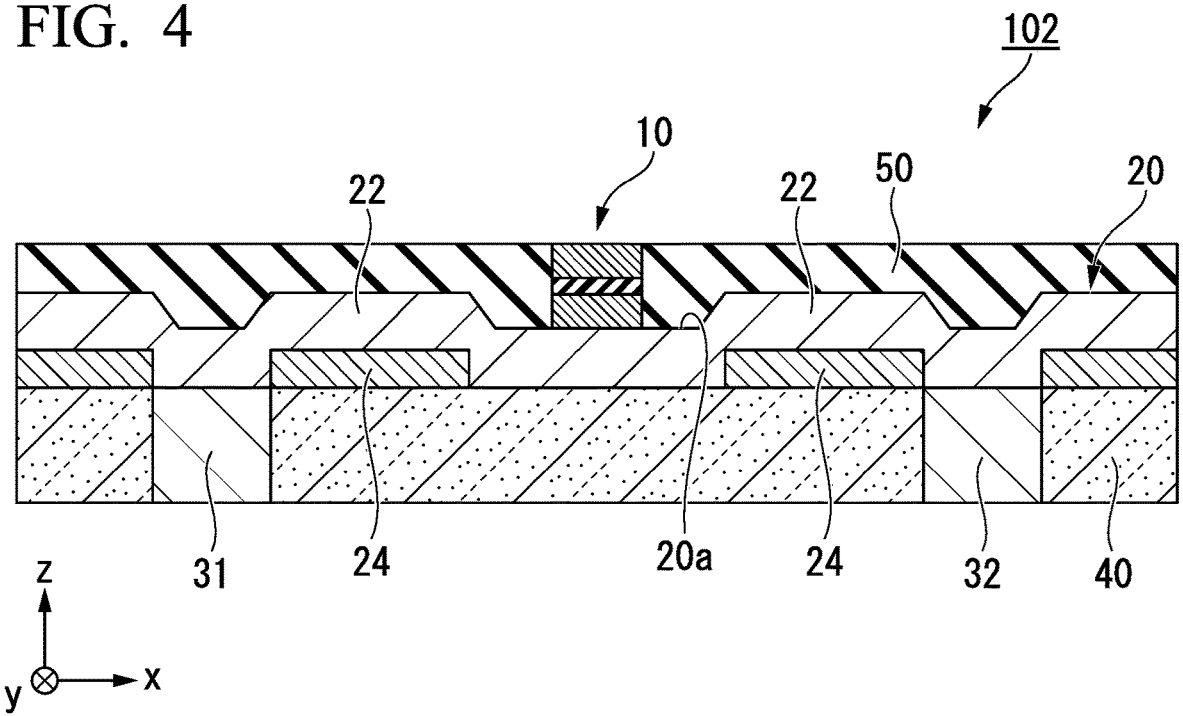
FIG. 4 is a schematic cross-sectional view of another example of the spin-orbit-torque magnetoresistance effect element according to the first embodiment.

Further, for example, FIG. 4 is a schematic cross-sectional view of another example of the spin-orbit-torque magnetoresistance effect element according to the embodiment. A spin-orbit-torque magnetoresistance effect element 102 shown in FIG. 4 is different from the spin-orbit-torque magnetoresistance effect element 100 shown in FIG. 1 in that the interlayer insulating film 50 is provided. The interlayer insulating film 50 is provided on the side wall of the functional unit 10.

Since the interlayer insulating film 50 is provided, a process of carrying heat between the convex portion 22 and the functional unit 10 becomes thermal conduction. The thermal conduction can carry more heat as compared with thermal radiation. Further, the interlayer insulating film 50 suppresses the short-circuiting between the convex portion 22 and the functional unit 10.

The interlayer insulating film 50 is desirably an oxide or a nitride of one or more elements selected from a group consisting of Si, Al, Ta, Mg, and Hf. The interlayer insulating film 50 containing these materials has excellent insulation and thermal conductivity.

(Spin-Orbit-Torque Magnetoresistance Effect Element Manufacturing Method)

The spin-orbit-torque magnetoresistance effect element according to the embodiment can be manufactured by several methods.

<First Manufacturing Method>

FIGS. 5A to 5H are schematic diagrams showing an example of a spin-orbit-torque magnetoresistance effect element manufacturing method according to the embodiment. A first manufacturing method includes the steps of: laminating a protection layer on a substrate and removing the protection layer excluding at least a position to be the convex portion; sequentially laminating layers to be the spin-orbit-torque wiring and the ferromagnetic layer on the protection layer; and forming a sacrificial layer on a part of the ferromagnetic layer and performing etching.

First, a protection layer 60 is laminated on the substrate 40 (FIG. 5A). Since the protection layer 60 becomes the insertion layer 24 of the spin-orbit-torque magnetoresistance effect element 100, the protection layer can be formed by the insertion layer 24. The protection layer 60 can be formed by a sputtering method, a chemical vapor deposition method (CVD method), or the like. Layers to be laminated below can be laminated in the same way.

Next, a resist 61 is applied onto the protection layer 60 and an opening portion is formed at a position provided with the first electrode 31 and the second electrode 32 by using photolithography (FIG. 5B). A conductive material is charged into the opening portion to form the first electrode 31 and the second electrode 32. Then, the resist 61 is removed while leaving the protection layer 60 (FIG. 5C).

Next, the resist 62 is applied while leaving a position provided with the functional unit 10 (FIG. 5D) and the protection layer 60 at a position provided with the functional unit is removed. The protection layer 60 is left only at a position to be the convex portion in the spin-orbit-torque magnetoresistance effect element 100 so that the insertion layer 24 is formed (FIG. 5E).

Then, a layer 63 to be the spin-orbit-torque wiring, a ferromagnetic layer 64, a nonmagnetic layer 65, and a ferromagnetic layer 66 are sequentially laminated on the substrate 40 provided with the insertion layer 24. The layer 63 to be the spin-orbit-torque wiring, the ferromagnetic layer 64, the nonmagnetic layer 65, and the ferromagnetic layer 66 have an unevenness reflecting the shape of the insertion layer 24 (FIG. 5F).

Finally, a sacrificial layer 67 is formed at a position provided with the functional unit 10 in the ferromagnetic layer 66 (FIG. 5G) and an unnecessary portion is etched (FIG. 5H). The etching may be wet etching or dry etching. In the layer 63 to be the spin-orbit-torque wiring, the ferromagnetic layer 64, the nonmagnetic layer 65, and the ferromagnetic layer 66, only a portion protected by the sacrificial layer 67 is left so that the spin-orbit-torque wiring 20 and the functional unit 10 are formed. In this order, the spin-orbit-torque magnetoresistance effect element 100 shown in FIG. 1 can be obtained.

FIGS. 6A to 6H are schematic diagrams showing an example of a spin-orbit-torque magnetoresistance effect element manufacturing method according to the embodiment. The spin-orbit-torque magnetoresistance effect element manufacturing method shown in FIGS. 6A to 6H is different from the spin-orbit-torque magnetoresistance effect element manufacturing method shown in FIGS. 5A to 5H in that the first electrode 31 and the second electrode 32 are wirings extending in a direction perpendicular to the drawing.

First, the substrate 40 is prepared (FIG. 6A) and a groove is formed by laser, lithography, or the like. Next, a seed film 71 is laminated on the substrate 40. The seed film 71 is also formed inside the groove. A barrier metal layer may be formed between the seed film 71 and the substrate 40. The barrier metal layer prevents the diffusion of the constituent elements from the first electrode 31 and the second electrode 32 to the substrate 40.

Next, metal plating is performed by using the seed film 71 as a seed. As the metal to be plated, metal used as the first electrode 31 and the second electrode 32 is used. An unnecessary metal plating is removed to expose the substrate 40 (FIG. 6C).

Next, the protection layer 70 is laminated on the substrate 40 (FIG. 6D) and the insertion layer 24 is formed by leaving the protection layer 70 only at a position to be the convex portion of the spin-orbit-torque magnetoresistance effect element 100 by the use of photolithography using the resist 72 (FIG. 6E).

Then, the layer 73 to be the spin-orbit-torque wiring, the ferromagnetic layer 74, the nonmagnetic layer 75, and the ferromagnetic layer 76 are sequentially laminated on the substrate 40 provided with the insertion layer 24. The layer 73 to be the spin-orbit-torque wiring, the ferromagnetic layer 74, the nonmagnetic layer 75, and the ferromagnetic layer 76 have an unevenness reflecting the shape of the insertion layer 24 (FIG. 6F).

Finally, the sacrificial layer 77 is formed at a position provided with the functional unit 10 in the ferromagnetic layer 76 (FIG. 6G) and an unnecessary portion is etched (FIG. 6H). The etching may be wet etching or dry etching. In the layer 73 to be the spin-orbit-torque wiring, the ferromagnetic layer 74, the nonmagnetic layer 75, and the ferromagnetic layer 76, only a portion protected by the sacrificial layer 77 is left so that the spin-orbit-torque wiring 20 and the functional unit 10 are formed.

<Second Manufacturing Method>

FIGS. 7A to 7H are schematic diagrams showing an example of a spin-orbit-torque magnetoresistance effect element manufacturing method according to the embodiment. A second manufacturing method includes the steps of: sequentially laminating layers to be the spin-orbit-torque wiring and the ferromagnetic layer on a substrate; forming a sacrificial layer coating portions to be the first ferromagnetic layer and the convex portion; and performing etching through the sacrificial layer.

First, a protection layer 80 is laminated on the substrate 40 (FIG. 7A). Next, a resist 81 is applied onto the protection layer 80 and an opening portion is formed at a position provided with the first electrode 31 and the second electrode 32 by using photolithography (FIG. 7B). A conductive material is charged into the opening portion so that the first electrode 31 and the second electrode 32 are formed. Then, the resist 81 is removed while including the protection layer 80 (FIG. 7C).

Next, a layer 83 to be the spin-orbit-torque wiring, a ferromagnetic layer 84, a nonmagnetic layer 85, and a ferromagnetic layer 86 are sequentially laminated on the substrate 40 provided with the first electrode 31 and the second electrode 32 (FIG. 7D).

Next, a resist 87 is provided at a position to be the concave portion of the spin-orbit-torque wiring 20 and a sacrificial layer 88 is laminated therefrom (FIG. 7E). When the resist 87 is removed, the sacrificial layer 88 is left only at a position to be the convex portion 22 of the spin-orbit-torque wiring 20 (FIG. 7F). Further, another sacrificial layer 89 is formed at a position provided with the functional unit 10 of the spin-orbit-torque wiring 20 (FIG. 7G).

Finally, an unnecessary portion is etched through the sacrificial layers 88 and 89 (FIG. 7H). The etching may be wet etching or dry etching. In the layer 83 to be the spin-orbit-torque wiring, the ferromagnetic layer 84, the nonmagnetic layer 85, and the ferromagnetic layer 86, only a portion protected by the sacrificial layers 88 and 89 is left so that the spin-orbit-torque wiring 20 and the functional unit 10 are formed. In this order, the spin-orbit-torque magnetoresistance effect element 101 shown in FIG. 3 can be obtained.

<Third Manufacturing Method>

FIGS. 8A to 8I are schematic diagrams showing an example of a spin-orbit-torque magnetoresistance effect element manufacturing method according to the embodiment. A third manufacturing method includes the steps of: sequentially laminating layers to be the spin-orbit-torque wiring and the ferromagnetic layer on a substrate; forming a protection layer coating portions to be the first ferromagnetic layer and removing an unnecessary portion to form the first ferromagnetic layer; forming a coating of an insulation layer coating the first ferromagnetic layer and the layer to be the spin-orbit-torque wiring; and laminating a material, which is a same as a material of the layer to be the spin-orbit-torque wiring, and thickening the layer to be the spin-orbit-torque wiring.

First, a protection layer 90 is laminated on the substrate 40 (FIG. 8A). Next, a resist 91 is applied onto the protection layer 90 and an opening portion is formed at a position provided with the first electrode 31 and the second electrode 32 by using photolithography (FIG. 8B). A conductive material is charged into the opening portion so that the first electrode 31 and the second electrode 32 are formed. Then, the resist 91 is removed while including the protection layer 90 (FIG. 8C).

Next, a layer 93 to be the spin-orbit-torque wiring, a ferromagnetic layer 94, a nonmagnetic layer 95, and a ferromagnetic layer 96 are sequentially laminated on the substrate 40 provided with the first electrode 31 and the second electrode 32 (FIG. 8D).

Next, a protection layer 97 is formed at a position provided with the functional unit 10 in the ferromagnetic layer 96 and an unnecessary portion is etched. The etching is performed to the layer 93 to be the spin-orbit-torque wiring so that the functional unit 10 is formed (FIG. 8E).

An insulation layer 98 is laminated on the protection layer 97 and the layer 93 to be the spin-orbit-torque wiring (FIG. 8F). Next, the insulation layer 98 is removed while excluding the side surfaces of the functional unit 10 and the protection layer 97 (FIG. 8G).

Next, a material, which is a same as a material of the layer to be the spin-orbit-torque wiring, and thickening the layer 93 to be the spin-orbit-torque wiring. At the same time, an insulation film 99 to be the interlayer insulating film is laminated on the layer 93 to be the spin-orbit-torque wiring (FIG. 8H).

Finally, the layer 93 to be the spin-orbit-torque wiring is arranged in a wire shape and the functional unit 10 is exposed (FIG. 8I). In this order, the spin-orbit-torque magnetoresistance effect element of which the convex portion is not inclined can be obtained.

Second Embodiment (Spin-Orbit-Torque Magnetization Rotational Element)

Figure 9:
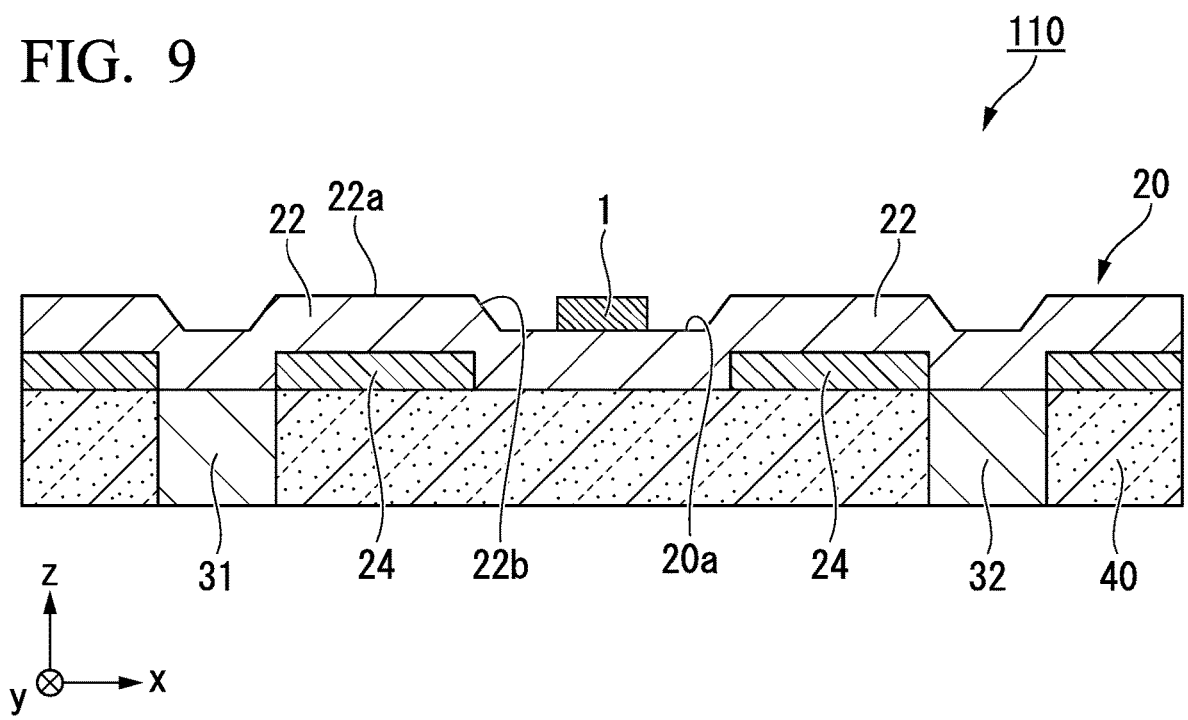
FIG. 9 is a schematic cross-sectional view of a spin-orbit-torque magnetization rotational element according to a second embodiment.

FIG. 9 is a schematic cross-sectional view of the spin-orbit-torque magnetization rotational element according to the embodiment. The spin-orbit-torque magnetization rotational element 110 shown in FIG. 9 is different from the spin-orbit-torque magnetoresistance effect element 100 shown in FIG. 1 only in that the nonmagnetic layer 3 and the second ferromagnetic layer 2 are not provided.

The spin-orbit-torque magnetization rotational element 110 can be used as the magnetoresistance effect element as described above. Further, the spin-orbit-torque magnetization rotational element 110 can be utilized alone as an anisotropic magnetic sensor or an optical element using a magnetic Kerr effect or a magnetic Faraday effect. When the magnetization is reversed, the spin current magnetization rotational element can be particularly called a spin current magnetization inverting element.

In the first ferromagnetic layer 1 and the spin-orbit-torque wiring 20 of the spin-orbit-torque magnetization rotational element 110, the same configuration and material as those of the first ferromagnetic layer 1 of the spin-orbit-torque magnetoresistance effect element 100 are used.

The spin-orbit-torque magnetization rotational element 110 can be manufactured by using the above-described spin-orbit-torque magnetoresistance effect element manufacturing method without the lamination of the nonmagnetic layer and the second ferromagnetic layer in the above-described spin-orbit-torque magnetoresistance effect element manufacturing method.

Third Embodiment (Magnetic Memory)

Figure 10:
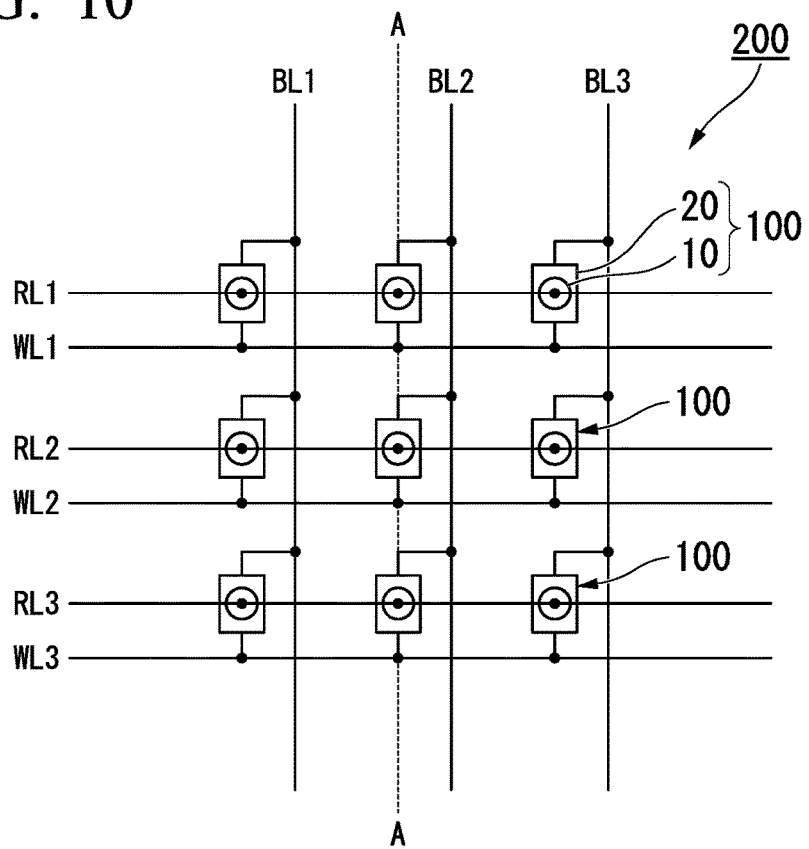
FIG. 10 is a schematic diagram of a magnetic memory including a plurality of spin-orbit-torque magnetoresistance effect elements.

FIG. 10 is a schematic diagram of a magnetic memory 200 including a plurality of spin-orbit-torque magnetoresistance effect elements 100 (see FIG. 1). FIG. 1 corresponds to a cross-sectional view obtained by cutting the spin-orbit-torque magnetoresistance effect element 100 along a plane A-A of FIG. 10. In the magnetic memory 200 shown in FIG. 10, the spin-orbit-torque magnetoresistance effect element 100 has a 3×3 matrix arrangement. FIG. 10 shows an example of the magnetic memory and the configuration, the number, and the arrangement of the spin-orbit-torque magnetoresistance effect element 100 can be arbitrarily set.

One of word lines WL1 to WL3, one of bit lines BL1 to BL3, and one of read lines RL1 to RL3 are connected to the spin-orbit-torque magnetoresistance effect element 100.

A writing operation is performed when a current flows to the spin-orbit-torque wiring 20 of the arbitrary spin-orbit-torque magnetoresistance effect element 100 by selecting the word lines WL1 to WL3 and the bit lines BL1 to BL3 to which a current is applied. Further, a reading operation is performed when a current flows in the lamination direction of the functional unit 10 of the arbitrary spin-orbit-torque magnetoresistance effect element 100 by selecting the read lines RL1 to RL3 and the bit lines BL1 to BL3 to which a current is applied. The word lines WL1 to WL3, the bit lines BL1 to BL3, and the read lines RL1 to RL3 to which a current is applied can be selected by a transistor or the like. That is, it is possible to utilize a magnetic memory by reading data of an arbitrary element from the spin-orbit-torque magnetoresistance effect elements 100.

Although preferred embodiments of the present disclosure have been described in detail, the present disclosure is not limited to specific embodiments and various modifications and changes can be made within the range of the spirit of the present disclosure described in claims.

INDUSTRIAL APPLICABILITY

It is possible to provide a spin-orbit-torque magnetization rotational element having excellent heat exhausting performance.

REFERENCE SIGNS LIST

1 First ferromagnetic layer
2 Second ferromagnetic layer
3 Non-magnetic layer
10 Functional unit
20, 21 Spin-orbit-torque wiring
20a First surface
22 Convex portion
22a Tip
22b Side surface
24 Insertion layer
31 First electrode
32 Second electrode
40 Substrate
50 Interlayer insulating film
100, 101, 102 Spin-orbit-torque magnetoresistance effect element

The invention claimed is:

1. A spin-orbit-torque magnetization rotational element comprising:
    a spin-orbit-torque wiring which extends in a first direction; and
    a first ferromagnetic layer which is laminated in a second direction intersecting the spin-orbit-torque wiring, wherein:
    the spin-orbit-torque wiring includes a convex portion which protrudes in the second direction in relation to a first surface at a connecting part between the spin-orbit-torque wiring and the first ferromagnetic layer, and
    a spin is implanted to the first ferromagnetic layer from the spin-orbit-torque wiring.

2. The spin-orbit-torque magnetization rotational element according to claim 1,
    wherein the convex portion configured to surround a periphery of the first ferromagnetic layer.

3. The spin-orbit-torque magnetization rotational element according to claim 1,
    wherein a side surface of the convex portion on the side of the first ferromagnetic layer is inclined in a direction away from the first ferromagnetic layer from the first surface toward a tip of the convex portion.

4. The spin-orbit-torque magnetization rotational element according to claim 1, further comprising:
    an insertion layer which is provided at a surface of the spin-orbit-torque wiring, the surface being opposite to the side with the first ferromagnetic layer at a position where the convex portion of the spin-orbit-torque wiring is provided.

5. The spin-orbit-torque magnetization rotational element according to claim 1,
    wherein the spin-orbit-torque wiring contains one or more elements selected from a group consisting of Ta, W, Pt, Au, Nb, Mo, Ru, Os, Rh, Ir, Pd, and Ag.

6. A spin-orbit-torque magnetoresistance effect element comprising:
    the spin-orbit-torque magnetization rotational element according to claim 1;

a nonmagnetic layer which is laminated on a surface of the first ferromagnetic layer, the surface being opposite to a surface contacting the spin-orbit-torque wiring; and a second ferromagnetic layer which sandwiches the first ferromagnetic layer and the nonmagnetic layer, wherein:

the first ferromagnetic layer, the nonmagnetic layer, and the second ferromagnetic layer constitute a functional unit configured to exhibit a magnetoresistance effect, and an upper electrode for reading a change in resistance value of the functional unit is connected to the upper portion of the functional unit.

7. The spin-orbit-torque magnetoresistance effect element according to claim 6, wherein a shortest distance between the convex portion and the functional unit is equal to or smaller than a height of the functional unit.

8. The spin-orbit-torque magnetoresistance effect element according to claim 6, wherein a shortest distance between the convex portion and the functional unit is equal to or larger than a difference between a height of the functional unit and a height of the convex portion.

9. The spin-orbit-torque magnetoresistance effect element according to claim 6, wherein a height of the convex portion is equal to or smaller than a height of the functional unit.

10. The spin-orbit-torque magnetoresistance effect element according to claim 6, further comprising:

an interlayer insulating film configured to protect a side wall of the functional unit, wherein the interlayer insulating film is an oxide or a nitride of one or more elements selected from a group consisting of Si, Al, Ta, Mg, and Hf.

11. A magnetic memory comprising:

a plurality of spin-orbit-torque magnetoresistance effect elements according to claim 6.

12. A method of manufacturing the spin-orbit-torque magnetization rotational element according to claim 1, the method comprising the steps of:

laminating a protection layer on a substrate and removing the protection layer excluding at least a position to be the convex portion;

sequentially laminating layers to be the spin-orbit-torque wiring and the ferromagnetic layer on the protection layer; and forming a sacrificial layer on a part of the ferromagnetic layer and performing etching.

13. A method of manufacturing the spin-orbit-torque magnetization rotational element according to claim 1, the method comprising the steps of:

sequentially laminating layers to be the spin-orbit-torque wiring and the ferromagnetic layer on a substrate;

forming a sacrificial layer coating portions to be the first ferromagnetic layer and the convex portion; and performing etching thorough the sacrificial layer.

14. A method of manufacturing the spin-orbit-torque magnetization rotational element according to claim 1, the method comprising the steps of:

sequentially laminating layers to be the spin-orbit-torque wiring and the ferromagnetic layer on a substrate;

forming a protection layer coating portions to be the first ferromagnetic layer, removing an unnecessary portion, and forming the first ferromagnetic layer;

forming a coating of an insulation layer coating the first ferromagnetic layer and the layer to be the spin-orbit-torque wiring; and laminating a material, which is a same as a material of the layer to be the spin-orbit-torque wiring, and thickening the layer to be the spin-orbit-torque wiring.

* * * * *